(12) United States Patent
Stone

(10) Patent No.: US 9,652,092 B2
(45) Date of Patent: May 16, 2017

(54) TOUCH-SENSITIVE INPUT DEVICE

(71) Applicant: Novalia Ltd, Cambridge (GB)

(72) Inventor: Kate Stone, Cambridge (GB)

(73) Assignee: Novalia Ltd, Cambridge (GB)

( * ) Notice: Subject to any disclaimer, the term of this patent is extended or adjusted under 35 U.S.C. 154(b) by 246 days.

(21) Appl. No.: 14/382,515

(22) PCT Filed: Mar. 1, 2013

(86) PCT No.: PCT/GB2013/050522
§ 371 (c)(1),
(2) Date: Sep. 2, 2014

(87) PCT Pub. No.: WO2013/128208
PCT Pub. Date: Sep. 6, 2013

(65) Prior Publication Data
US 2015/0049051 A1 Feb. 19, 2015

(30) Foreign Application Priority Data

Mar. 2, 2012 (GB) .................................. 1203729.7

(51) Int. Cl.
*G06F 3/041* (2006.01)
*G06F 3/044* (2006.01)
*G06F 3/047* (2006.01)
*H03K 17/96* (2006.01)

(52) U.S. Cl.
CPC .............. *G06F 3/044* (2013.01); *G06F 3/047* (2013.01); *H03K 17/9622* (2013.01); *G06F 2203/04103* (2013.01); *H03K 2017/9602* (2013.01)

(58) Field of Classification Search
CPC . G06F 2203/04103; G06F 3/044; G06F 3/047
See application file for complete search history.

(56) References Cited

U.S. PATENT DOCUMENTS

| 6,188,391 | B1 | 2/2001 | Seely et al. |
| 2009/0002337 | A1 | 1/2009 | Chang |
| 2011/0006316 | A1 | 1/2011 | Ing et al. |
| 2011/0007011 | A1 | 1/2011 | Mozdzyn |
| 2011/0057900 | A1* | 3/2011 | Huang .................... G06F 3/044 345/174 |
| 2011/0063240 | A1 | 3/2011 | Tanabe |

(Continued)

FOREIGN PATENT DOCUMENTS

| CN | 101958315 A | 1/2011 |
| DE | 202011052063 U1 | 12/2011 |

(Continued)

OTHER PUBLICATIONS

GB Search Report GB1203729.7 dated Jul. 2, 2012.

(Continued)

*Primary Examiner* — Nelson Rosario
(74) *Attorney, Agent, or Firm* — McCarter & English, LLP; David R. Burns

(57) ABSTRACT

A touch-sensitive input device (2) in the form of a touch panel is described. The device comprises a transparent substrate (11) and at least one transparent electrode (14) disposed on the substrate, the at least one electrode comprising a layer (16) of opaque conductive material having holes (35) therein so as to form a mesh of opaque conductive material.

24 Claims, 8 Drawing Sheets

(56) References Cited

U.S. PATENT DOCUMENTS

| | | | |
|---|---|---|---|
| 2011/0069029 A1* | 3/2011 | Ryu | G06F 3/0416 345/173 |
| 2011/0279410 A1 | 11/2011 | Han et al. | |
| 2012/0013544 A1* | 1/2012 | Philipp | G06F 3/041 345/173 |

FOREIGN PATENT DOCUMENTS

| | | |
|---|---|---|
| JP | 60065325 | 4/1985 |
| JP | 2003280807 A | 10/2003 |
| JP | 2011018194 A | 1/2011 |
| WO | 2009/108765 A2 | 9/2009 |
| WO | 2009/108765 A3 | 11/2009 |
| WO | 2010/102491 A1 | 9/2010 |
| WO | 2011/023856 A1 | 3/2011 |
| WO | 2011/062301 A1 | 5/2011 |

OTHER PUBLICATIONS

Examination Report issued in Great Britain Application No. GB1203729.7 dated Mar. 9, 2016. 2 pages.
Examination Report issued in Great Britain Application No. GB1413075.1 dated Mar. 9, 2016. 2 pages.
Examination Report issued in Great Britain Application No. GB1203730.5 dated Mar. 9, 2016. 2 pages.
GB Search Report GB1203730.5 dated Jul. 2, 2012.
GB Search Report GB1203730.5 dated May 6, 2014.
Day S, Low Cost Touch Sensor on the Underside of a Casing, Synaptics, Inc., 2004.
Unander T, et al., Printed touch sensor for interactive packaging and display, IEEE Polytronic Conference, 2007, pp. 12-17.
Office Action in related Chinese Patent Application CN 101958315A issued Feb. 2, 2017.

* cited by examiner

TOUCH-SENSITIVE INPUT DEVICE

RELATED APPLICATIONS

This application is a 35 U.S.C. §371 national stage application of International Application No. PCT/GB2013/050522, filed Mar. 1, 2013, which claims the benefit of United Kingdom Patent Application No. 1203729.7, filed Mar. 2, 2012. The entire contents of each of the foregoing applications are explicitly incorporated herein by reference.

FIELD OF THE INVENTION

The present invention relates to a touch-sensitive input device, such as a capacitive touch panel or capacitive touch switch.

BACKGROUND

Touch-sensitive input devices, such as touch panels, are being increasingly employed in user interfaces in a wide variety of electronic consumer products, such as phones, music players, tablet computers and cameras, as well as household appliances, electronic office equipment, automobiles and industrial machinery.

In many applications, the touch panel is integrated into a display to form a touchscreen. Thus, in these applications, the touch panel needs to be transparent and so touch panel electrodes must be transparent. Therefore, the electrodes are made from a transparent conductive material, such as indium tin oxide. However, such transparent conductive materials are usually expensive and deposited using special equipment.

SUMMARY

The present invention seeks to provide a touch-sensitive input device which is cheap and easy to fabricate.

According to a first aspect of the present invention there is provided a touch-sensitive input device comprising a transparent substrate and at least one transparent electrode disposed on the substrate. The at least one electrode comprises a layer of opaque conductive material having holes therein so as to form a mesh of opaque conductive material.

Thus, the device can be fabricated using relatively inexpensive conductive materials, such as silver-based conductive ink, using relatively a simple and cheap process, such as flexographic printing, thereby avoiding the need for expensive transparent conductive materials and specialist deposition processes.

The transparent substrate has first and second opposite faces. The at least one transparent electrode may include a first set of transparent electrodes disposed on the first face of the substrate, the electrodes generally extending in a first direction and spaced apart along a second, transverse direction and a second set of transparent electrodes disposed on the second face of the substrate, the electrodes generally extending in the second direction and spaced apart along the first direction and the first and second sets of electrodes overlap.

Thus, a touch panel (which can provide x-y input) can be easily and cheaply formed.

The transparent substrate may be a first transparent substrate and the at least one transparent electrode may include a first set of transparent electrodes disposed on the first substrate, the electrodes generally extending in a first direction and spaced apart along a second, transverse direction.

The device may further comprise a second transparent substrate overlying the first transparent substrate and a second set of transparent electrodes disposed on the second substrate, the electrodes generally extending in the second direction and spaced apart along the first direction, wherein the first and second sets of electrodes overlap.

This can help facilitate fabrication since the two sets of electrodes can be formed separately on different substrates and the two electrode-bearing substrates can later be aligned and joined together.

In the first set of electrodes, width of an electrode between outermost edges of the electrode may periodically increase and decrease along the electrode so as to form wide sections and narrow sections of the electrode and the electrodes may be arranged so as to form narrow and wide spaces between adjacent electrodes. In the the second set of electrodes, width of an electrode between outermost edges of the electrode may periodically increase and decrease along the electrode so as to form wide sections and narrow sections of the electrode. Wide sections of an electrode in the second set of electrodes may be disposed in wide spaces between adjacent electrodes in the first set of electrodes.

The wide sections may be lozenge shaped. This can help to determine the relative position of a finger between two adjacent rows (or columns) of electrodes.

The wide section of an electrode in the first set of electrodes may have a maximum width of between 5 mm and 20 mm. The narrow section of an electrode in the first set of electrodes may have a minimum width of between 1 mm and 5 mm. The wide space between adjacent electrodes in the first set of electrodes may have a maximum width of between 5 mm and 20 mm.

Each electrode may have a length of at least 100 mm.

The device may further comprise at least one conductive track, each conductive track running from or close to an edge of the substrate and being directly connected to a respective transparent electrode, the conductive track a higher sheet resistance than the transparent electrode.

At least some of the transparent electrodes may comprise a layer of opaque conductor-based conductive ink. The conductive ink may be water based. The conductive ink may be solvent based. The conductive ink may be curable, for example using ultraviolet (UV) light. The conductor comprises a metal-based conductive ink, such as silver- or copper-based conductive ink, or a carbon-based conductive ink. A semiconductor polymer is preferably not used.

At least some of the transparent electrodes may comprise a metallic foil, which may be formed by hot- or cold-foil stamping.

The layer of opaque conductive material may have a thickness of at least 1 µm, at least 2 µm, at least 5 µm, at least 8 µm, at least 10 µm, at least 12 µm or at least 15 µm. The layer of opaque conductive material may have a thickness of no more than 100 µm, no more than 50 µm, no more than 20 µm or no more than 10 µm. Dry conductive ink, for example applied by flexography, may have a thickness of between 1 and 10 µm.

The substrate may be flexible and may comprise a plastic material. For example, the substrate may comprise polyethylene terephthalate (PET), polypropylene (PP) or polyethylene naphthalate (PEN). However, the substrate may be rigid and/or may comprise silica glass. The substrate may have a thickness of at least 30 µm, at least 50 µm or at least 80 µm. The substrate may have a thickness no more than 350 µm, no more than 200 µm or no more than 100 µm.

The electrodes may be coated with a transparent insulating layer.

The electrodes are preferably deposited in a single step, for example without a subsequent electroplating step.

According to a second aspect of the present invention there is provided apparatus comprising the touch-sensitive input device, a controller and at least one output device (such as liquid crystal display (LCD), light emitting diodes and/or a speaker). The controller is configured to cause the output device to output a signal (e.g. light, sound etc) in response to user operation of the touch-sensitive input device. The touch-sensitive input device may be mounted on or over the output device, such as an active-matrix LCD. The touch-sensitive input device and the output device may be mounted with an air gap between the touch-sensitive input device and the output device, such as an active-matrix LCD.

According to a third aspect of the present invention there is provided method of fabricating a touch-sensitive input device, the method comprising forming at least one transparent electrode on a transparent substrate, the at least one electrode comprising a layer of opaque conductive material having holes therein so as to form a mesh of opaque conductive material.

Forming the at least one transparent electrode may comprise printing a patterned layer of the opaque conductive material on the transparent substrate. Forming the at least one transparent electrode may comprise stamping a patterned layer of the opaque conductive material onto the transparent substrate.

Forming the at least one transparent electrode may comprise forming at least one transparent electrode on a first face of the substrate and forming at least one transparent electrode on a second face of the substrate.

The method may further comprise forming at least one transparent electrode on another transparent substrate, the at least one electrode comprising a layer of opaque conductive material having holes therein so as to form a mesh of opaque conductive material and overlapping the transparent sheets.

The method may comprise forming first and second sets of electrodes on the same face of the substrate. The method may comprise folding the substrate so that the first and second sets of electrodes overlap. The method may comprise inserting an insulating sheet between the first and second sets of electrodes. The insulating sheet may comprise a portion of the substrate which is free of conductive material. The method may comprise coating the electrodes with a transparent insulating layer.

According to a fourth aspect of the present invention there is provided apparatus for fabricating a touch-sensitive input device, the apparatus comprising means for providing transparent sheet and means for forming at least one transparent electrode on the transparent sheet, the electrode forming means configured to provide a layer of opaque conductive material having holes therein so as to form a mesh of opaque conductive material.

Thus, a moving continuous sheet process, high-speed single-sheet process or other high-volume/high-speed process may be used.

The sheet providing means may include a roll configured to pay out the sheet or a single sheet feeder. The electrode-forming means may comprise a printer, such as gravure printing press, an offset printing press, a flexographic printing press or an inkjet printer. The electrode-forming means may comprise a foil stamp.

The apparatus may further comprise another, separate means for forming at least one transparent electrode, the electrode forming means configured to provide a layer of opaque conductive material having holes therein so as to form a mesh of opaque conductive material, wherein the electrode forming means are configured to form electrodes on first and second opposite sides of the sheet.

The apparatus may further comprise means for cutting the sheet to form separate substrates, such as rotary die cutter or a laser.

BRIEF DESCRIPTION OF THE DRAWINGS

Certain embodiments of the present invention will now be described, by way of example, with reference to the accompanying drawings in which.

DETAILED DESCRIPTION OF CERTAIN EMBODIMENTS

Figure 1:
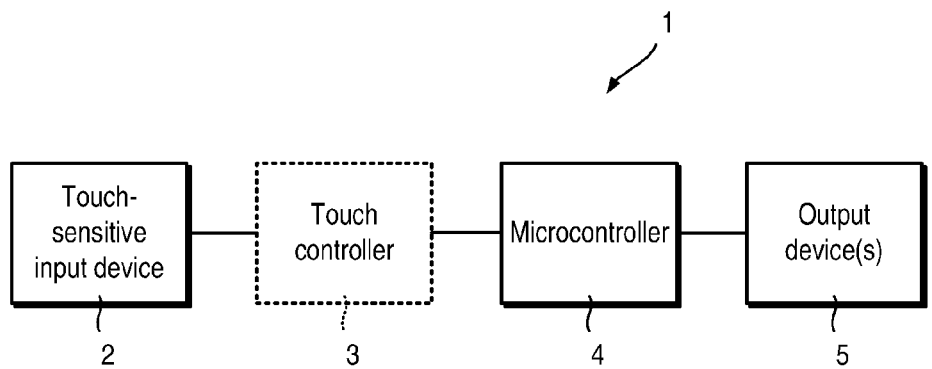
FIG. 1 is a block diagram of a device which includes a touch-sensitive input device in accordance with the present invention.
Figure 2:
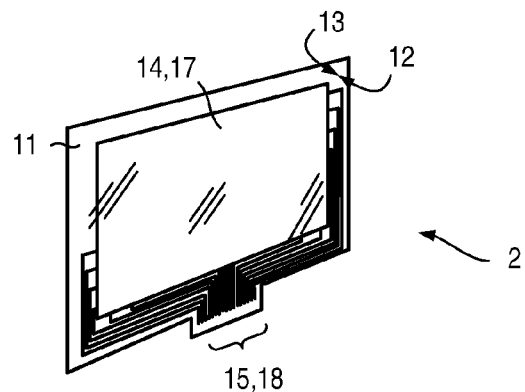
FIG. 2 is a perspective view of a touch-sensitive input device in accordance with the present invention.
Figure 3:
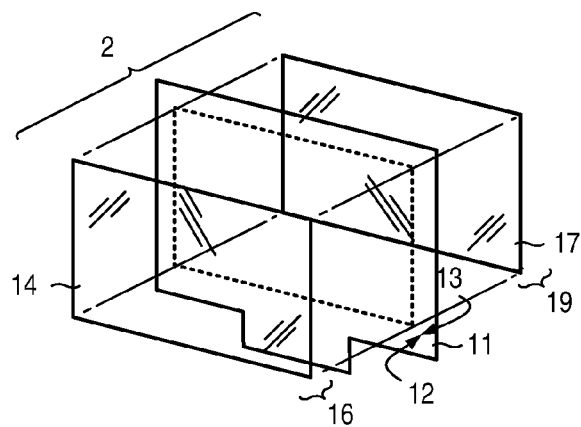
FIG. 3 is an exploded isometric view of the touch-sensitive input device shown in FIG. 2.

Referring to FIG. 1, an electronic device 1 is shown. The device 1 may take the form of a tablet computer, phone, music player, camera, window display, toy, watch, game or light panel. The device 1 may take the form of a user interface or control panel of a larger device or appliance such as a tablet computer, phone, music player, camera, household appliance, item of electronic office equipment, automobile or industrial machinery.

The device 1 includes a transparent touch-sensitive input device 2 in the form of a capacitive touch panel, an optional (dedicated) touch controller 3, a microcontroller 4 and output devices 5 such as a liquid crystal display (LCD), projector, light emitting diodes and/or a speaker. The microcontroller may take the form of Texas Instruments™ MSP430™ microcontroller. However, other microcontrollers can be used. Moreover, the device 1 may comprise a computer system comprising a plurality of integrated circuits (not shown) providing one or more processors, memory and input/output interfaces interconnected by a bus system. Components and peripheral devices, such as capacitors and resistors, are not shown in FIG. 1. Other optional input devices, such as an image sensor (for a camera) or a microphone, are not shown in FIG. 1.

The touch-sensitive input device 2 may be mounted in front of an output device in the form of a display so as to provide a touch panel display. The touch-sensitive input device 2 and display 5 may be arranged such there is an air gap between the touch-sensitive input device 2 and display 5 so as to prevent interference.

The touch-sensitive input device 2 may be mounted to another substrate, such as a sheet or plate of glass or plastic. For example, the touch-sensitive input device 2 may be mounted in front or behind a pane of glass which may be back-lit by an output device 5 in the form of a projector. The touch-sensitive input device 2 may be mounted in front of or behind the front face of a clock or watch.

Referring to FIGS. 2 to 8, the touch-sensitive input device 2 comprises a transparent, electrically-insulating substrate 11 having first and second opposite sides 12, 13 (herein also referred to as "faces"). The substrate has a thickness, $t_s$, of about 30 µm to about 350 µm. The substrate 11 is flexible and is formed from plastic, such as polyethylene terephthalate (PET) which has a relative permittivity, $\epsilon_r$. However, in some examples, the substrate 11 can be rigid.

A first set of electrodes 14 and first set of conductive tracks 15 are formed directly on the first side 12 of the substrate 11. The first set of electrodes 14 and the first set of tracks 15 comprise different regions of a layer 16 of an opaque, silver-based conductive ink having a thickness, $t_1$, of about 10 µm.

A second set of electrodes 17 and a second set of conductive tracks 18 are formed directly on the second side 13 of the substrate 11. The second set of electrodes 17 and second set of tracks 18 comprise different regions of a layer 19 of the opaque, silver-based conductive ink having a thickness, $t_2$, of about 10 µm.

The substrate 11 is disposed between the first and second sets of electrodes 14, 17 and electrically insulates the first set of electrodes 14 from the second set of electrodes 17.

A silver-based conductive ink is usually cheaper than a transparent conductive material (such as indium tin oxide) and can be deposited by printing.

The conductive ink is a water-based conductive ink and may be applied by flexographic printing. However, other forms of ink, such as a solvent-based conductive ink, can be used and other printing processes, such as ink jet printing, may be employed. Other types of conductive inks can be used, such as copper- or carbon-based conductive inks. The same or different conductive inks can be used for the first and second layers 16, 19. The same or different thicknesses of conductive ink can be used for the first and second layers 16, 19.

A water-based conductive ink may have an application viscosity between 90 to 300 centipoise (cP). A UV-cured conductive ink may have an application viscosity of about 250 to 600 cP. A solvent-based conductive ink may have an application viscosity of 100 to 500 cP.

A water- or solvent-based conductive ink may have a solid content of 15 to 80% solids by volume and/or up to 95% by weight. A UV-cured conductive ink may be considered effectively to be 100% by volume or weight.

Figure 4:
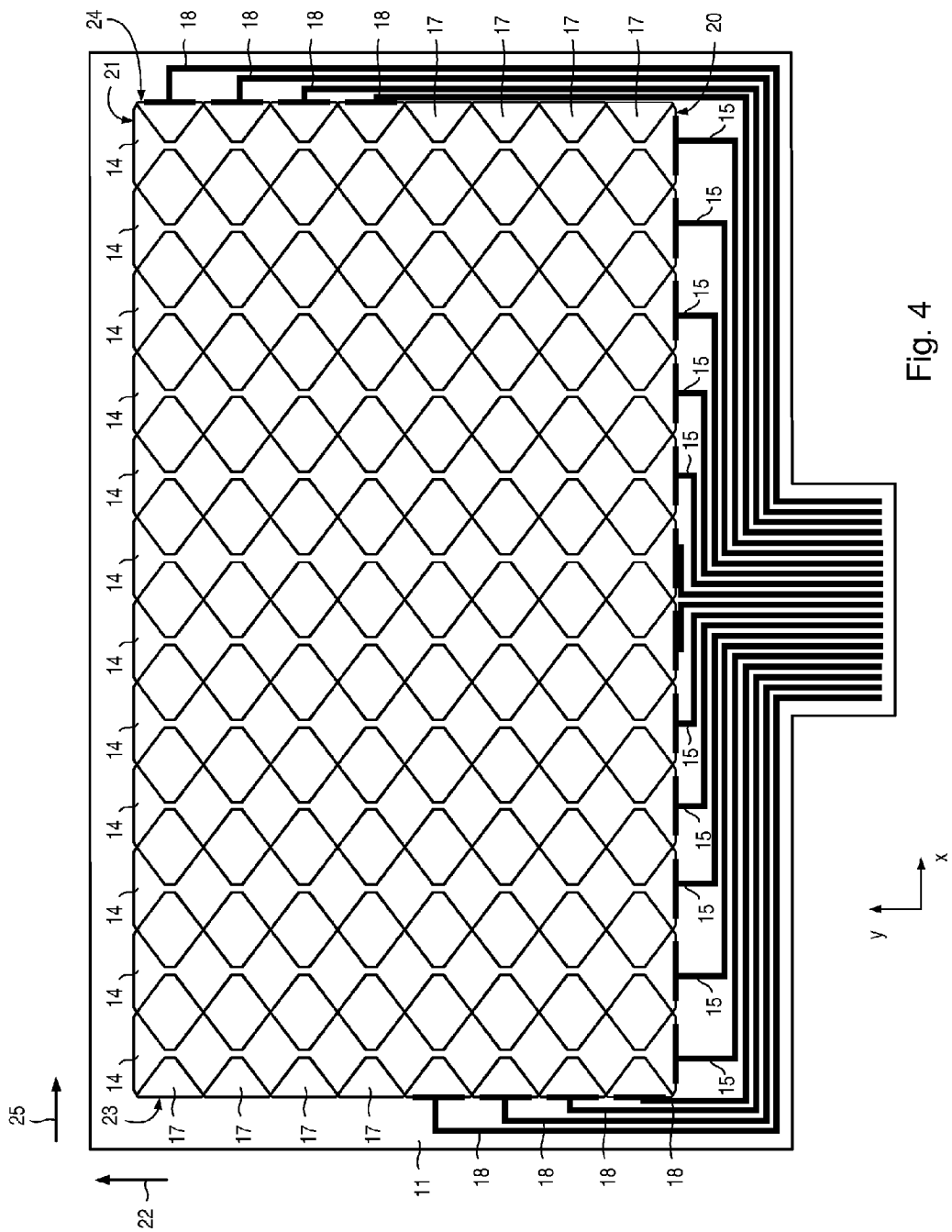
FIG. 4 is a plan view of the touch-sensitive input device shown in FIGS. 2 and 3 which includes first and second sets of electrodes on a substrate.

Referring to FIGS. 4, 5, 7 and 8, each of the first set of electrodes 14 extends between first and second edges 20, 21 (in FIG. 4 shown as bottom and top edges respectively of the set first set of electrodes 14) in a first direction 22 to form lines or strips. The electrodes 14 are arranged between third and fourth edges 23, 24 (in FIG. 4 shown as left-hand and right-hand edges of the second set of electrodes 17) in a second, perpendicular direction 25 to form an array of spaced-apart electrodes. In this example, the first set of electrodes 14 are arranged in a row (along the x-axis) as set of m columns (extending along the y-axis). In this example, m=12.

Figure 5:
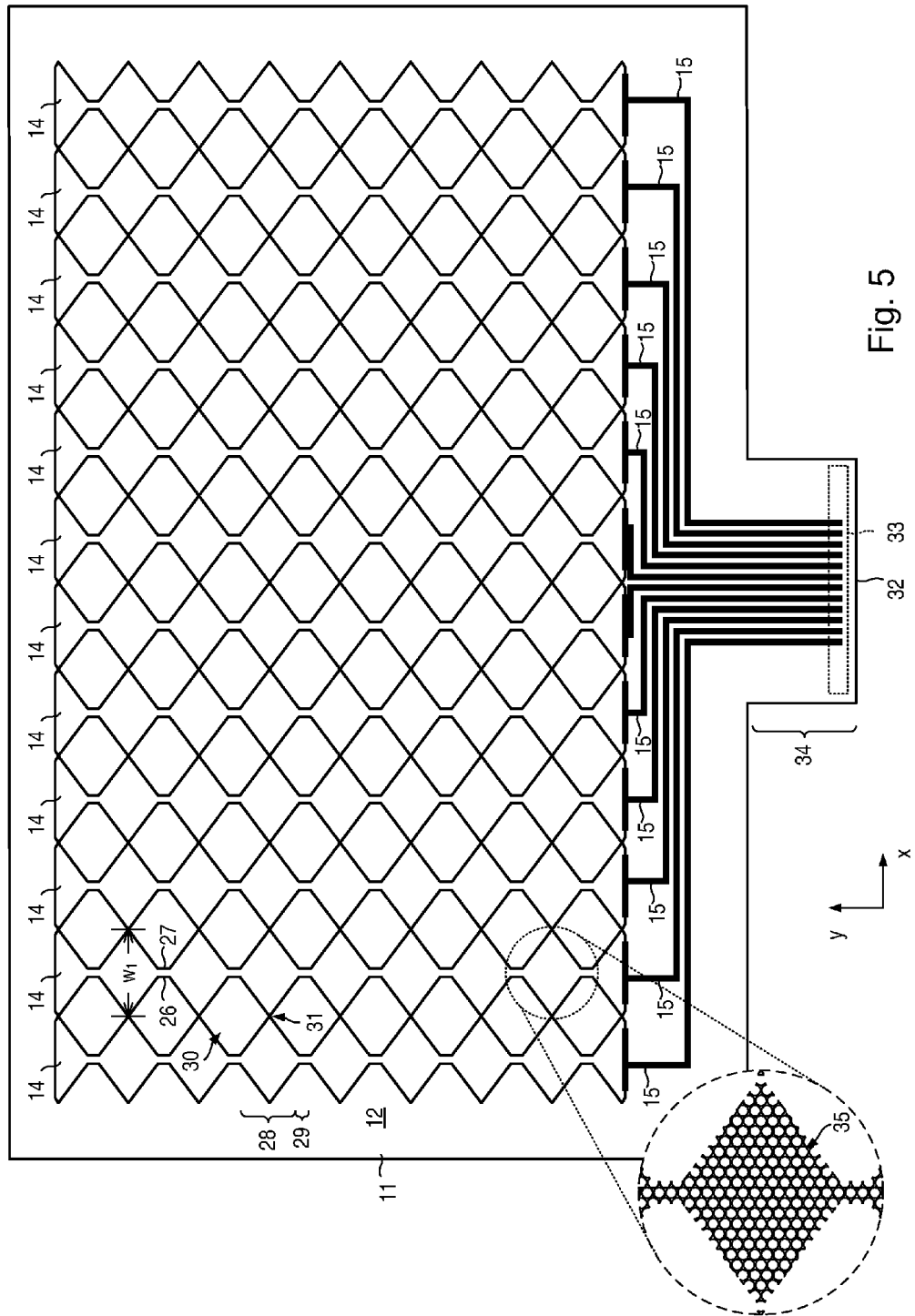
FIG. 5 is a plan view of the first set of electrodes shown in FIG. 4.

Referring in particular to FIG. 5, the width, $w_1$, of each electrode 14 between outer edges 26, 27 of an electrode 14 (in this example, left and right edges of an electrode) varies periodically. Each of the first set of electrodes 14 comprises a chain of wide and narrow sections 28, 29. In this case, the wide sections 28 are generally lozenge-shaped and the narrow sections 29 are generally rectangular. The wide sections 28 of adjacent electrodes 14 are aligned to form a string of narrow and wide inter-electrode spaces 30, 31. In this case, the wide spaces 31 are generally lozenge-shaped.

A set of conductive tracks 15 each, having a 'T-shaped end, is connected to the ends the first set electrodes 14 along the first edge 21. Each conductive track 15 has a width, $w_t$, which may be, for example, between about 0.5 mm and 2 mm. Each conductive track 15 follows a path towards an edge 32 of the substrate 11. The conductive tracks 15 terminate in a region 33 at or close to (for example, within a few millimeters or centimeters) the edge 32 of the substrate 11. As shown in FIG. 5, the substrate 11 has a tab (or "tongue") region 34.

The first set of electrodes 14 are perforated by a lattice of holes 35 such that a mesh of opaque conductive material is formed. The size and density of the holes 35 are arranged to allow at least 70% of visible light to pass through the electrode 14. The size and density of the holes 35 are arranged to allow at least 80%, at least 90% or at least 95% of visible light. In this example, the holes 35 are circular (in plan view) and are arranged hexagonally. In this case, the holes 35 have a diameter, d, of about 2 mm and a pitch, p, of about 3 mm.

Referring to FIGS. 4, 6, 7 and 8, each of second set of electrodes 17 extends between third and fourth edges 23, 24 in the second direction 25 to form lines or strips. The electrodes 17 are arranged between first and second edges 20, 21 along the first direction 22 to form an array of spaced-apart electrodes. In this example, the second set of electrodes 17 are arranged in a column (along the y-axis) as set of n rows (extending along the x-axis). In this example, n=8.

The width, $w_2$, of each electrode 17 between outer edges 46, 47 (in this case, upper and lower edged) varies periodically. Each electrode 17 comprises a chain of wide and narrow sections 48, 49. In this case, the wide sections 48 are generally lozenge-shaped and the narrow sections 49 are generally rectangular. The narrow sections 49 are aligned to form a string of wide and narrow inter-electrode spaces 50, 51. In this case, the wide spaces 50 are generally lozenge-shaped (or "diamond-shaped").

The wide sections 48 of the second set of electrodes 17 are aligned with the wide spaces 30 between electrodes 14 in the first set of electrodes 14. Preferably, a wide section 48 of an electrode 17 fills a corresponding wide space 30 between electrodes 14 thereby maximising the areas of the electrodes 14, 17 and so variation in coupling when the user's finger touches or is brought close to the device 2.

When a finger, stylus or other pointer is placed on or close to the device 2, it bridges a pair of adjacent electrodes ($m_i$, $m_{i+1}$) in the first set of electrodes 14 and a pair of adjacent electrodes ($n_j$, $n_{j+1}$) in the second set of electrodes 17. The microcontroller 4 (or touch controller 3) detects the change in capacitance between the electrodes and, thus, can determine a set of x, y coordinates. In the case of the lozenge-shaped electrodes, the degree of coupling between electrodes varies with position between the electrodes. Therefore, a more accurate set of x, y coordinate can be determined.

A set of conductive tracks 18 each, having a 'T-shaped end, is connected to the ends of the second set electrodes 17 along the third and fourth edges 23, 24. Each conductive track 28 has a width, $w_t$, which may be, for example, between about 0.5 mm and 2 mm. Each conductive track 28 follows a path towards the edge 32 of the substrate 11. The conductive tracks 18 terminate in the region 32 at or close to the edge of the substrate 11.

Figure 6:
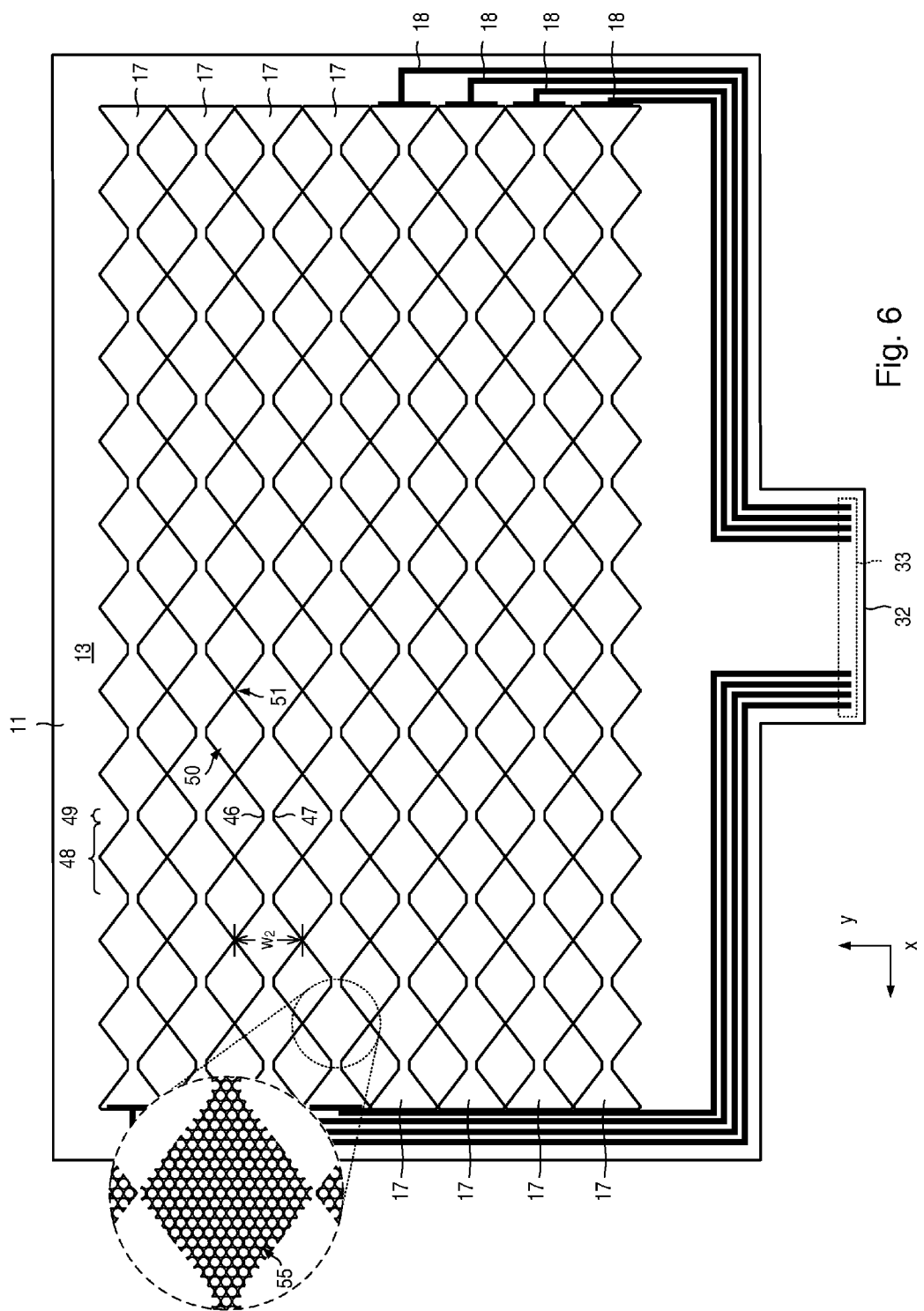
FIG. 6 is a plan view of the second set of electrodes shown in FIG. 4.
Figure 7:
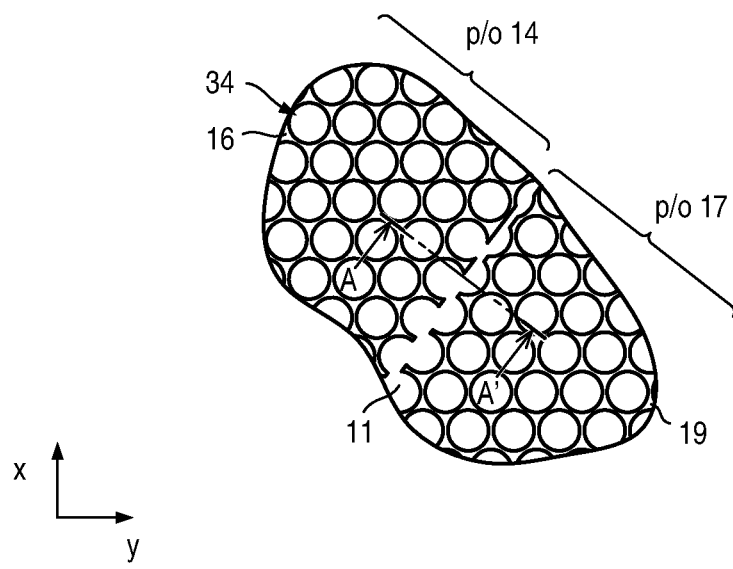
FIG. 7 is a magnified plan view of part of the touch-sensitive input device shown in FIG. 4.
Figure 8:
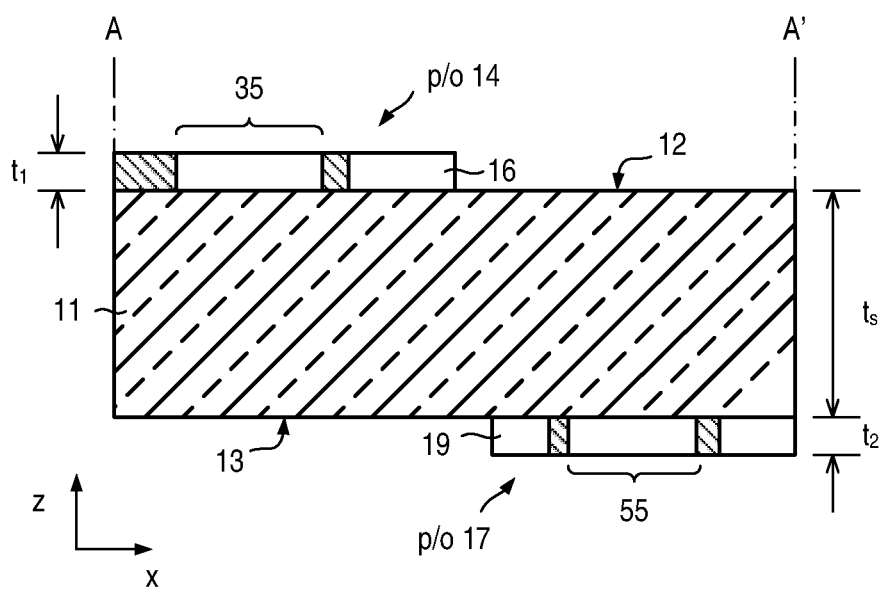
FIG. 8 is a cross-sectional view of the part of the touch-sensitive input device taken along the line AA'.

As shown in FIG. 6, the electrodes 17 are perforated by a lattice of holes 55 such that a mesh of opaque conductive material is formed. The size and density of the holes 55 are arranged to allow at least 70%, at least 80%, at least 90% or at least 95% of visible light to pass through an electrode 17. In this example, the holes 55 are circular (in plan view) and are arranged hexagonally. In this case, the holes 55 have a diameter, d, of about 2 mm and a pitch, p, of about 3 mm.

Figure 9:
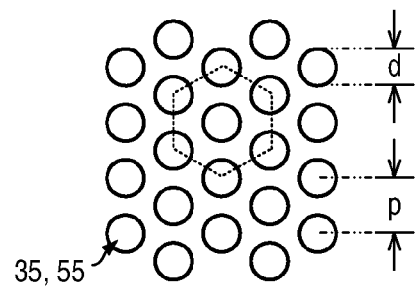
FIG. 9 illustrates a first arrangement of holes in an electrode.

FIG. 9 illustrates a pattern of holes 35, 55 used for the first and second sets of electrodes 14, 17. As explained earlier, the holes 35, 55 are arranged based on a hexagon-shaped basis. However, other arrangements can be used.

Figure 10:
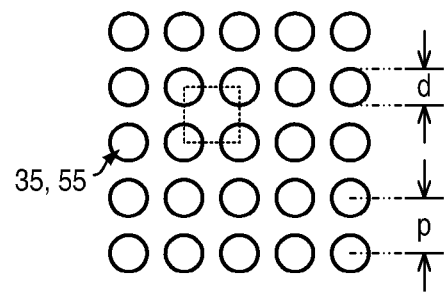
FIG. 10 illustrates a second arrangement of holes in an electrode.

FIG. 10 illustrates another pattern of holes 35, 55 which can be used for the first and second sets of electrodes 14, 17. In this case, the holes 35, 55 are arranged based on a rectangle (in particular a square) basis.

Other bases can be used. A random arrangement of holes can be used. This can be used to avoid Moiré patterns.

In the examples hereinbefore described, the holes 35, 55 are circular.

FIGS. 11*a* to 11*d* show other shapes of hole which can be used including, for example, an elliptical hole 61, a square hole 62, a rectangular hole 63 and a (regular) hexagonal hole 64. However, other shapes of hole can be used.

The first and second electrodes 14, 17 can have different arrangements of holes and may have different shaped holes. The first and second electrodes 14, 17 may have holes of different sizes and different pitches.

Figure 12:
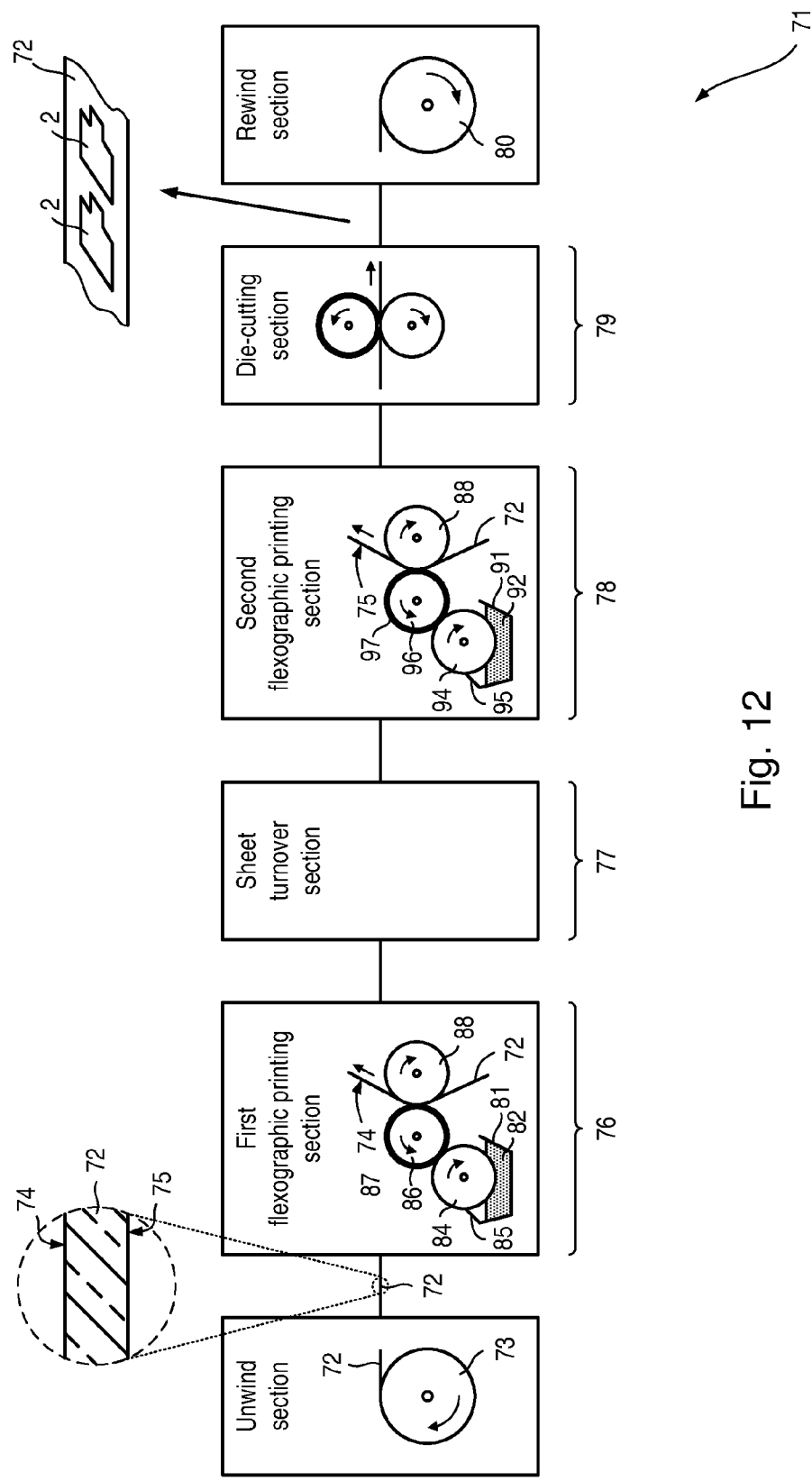
FIG. 12 is a schematic diagram of a moving continuous sheet process for fabricating the touch-sensitive input device shown in FIGS. 2 and 3.

Referring to FIG. 12, apparatus 71 (or a "press") for manufacturing the touch-sensitive input device 2 (FIG. 2) is shown.

Figure 11:
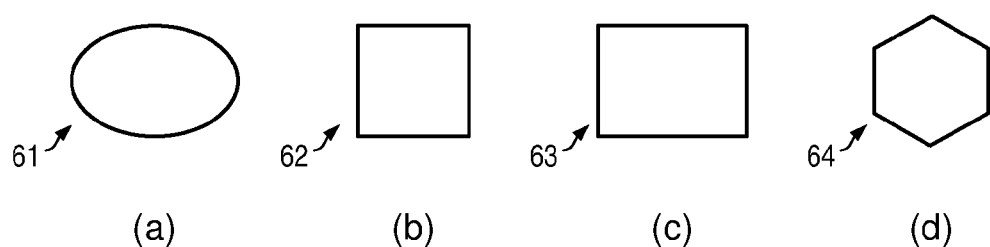
FIGS. 11a to 11d illustrates alternative shapes of holes.

As shown in FIG. 11, the press 71 is based on a moving continuous flow process.

A sheet (or "web") of transparent film 72 is wrapped around an unwind roller 73. The sheet 72 has first and second surfaces 74, 75.

The sheet 72 is paid out from the unwind roller 73 and passes through a series of sections 76, 77, 78, 79 to produce an array of devices 2 which can be wound onto a take-up roller 80.

A first printing section 76 takes the form of a flexographic printing section which includes an ink pan 81 holding conductive ink 82, an anilox roll 84, a doctor blade 85 arranged to control the ink 82 on the anilox roll 84, a plate cylinder 86 having a plate 87 bearing an image of the first set of electrodes 14 and tracks 15 and an impression cylinder 88. The plate cylinder 86 is used to apply conductive ink 82 to the first surface 74 of the sheet 72.

The first printing section 76 includes a drying section (not shown) which may include hot air blowers (not shown) and/or lamps (not shown) to help dry or cure the conductive ink 82.

A section 77 may be included to turn over the sheet 72 so as to allow a second printing section 78 to print on the second surface 74 of the sheet 72. In some presses, the turnover section 77 may be incorporated into the first and/or section printing sections or may be omitted if the second printing section 78 is able to print on the second surface 74 of the sheet 72 without the need to turn the sheet 72 over. A second printing section 78 takes the form of a flexographic printing section which includes an ink pan 91 holding conductive ink 92, an anilox roll 94, a doctor blade 95 arranged to control the ink 92, a plate cylinder 96 having a plate 97 bearing an image of the second set of electrodes 17 and tracks 18 and an impression cylinder 98. The plate cylinder 96 is used to apply the conductive ink 92 to the second surface 75 of the sheet 72.

The second printing section 78 includes a drying section (not shown) which may include hot air blowers and/or lamps to help dry or cure the conductive ink 92.

The first and/or second printing sections 76, 78 may include an additional inking roller (or "meter roller") which applies ink to the anilox roller. The doctor blade may be formed as part of blade unit.

A cutting section 78 may be included. The cutting section 78 may take the form of a rotary die cutting roller 101 and a counter impressing roller 102.

As explained earlier, the device 2 may be fabricated using the press 71 shown in FIG. 12. However, other arrangements and other types of manufacturing process can be used. For example, other printing processes, such as ink jet or gravure printing, may be used. A sheet fed process can be used in which single planar sheets are processed. This type of process may be used if the sheet is sufficiently rigid.

The process may include printing conductive ink on only one side of the sheet 72 and device 2 may be formed by folding the sheet 72 so that the first and second sets of electrodes 14, 17 overlap. Thus, the turnover section 77 can be omitted.

Figure 13:
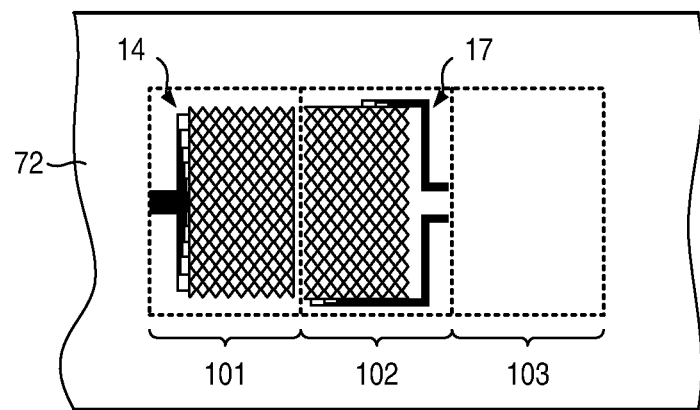
FIG. 13 shows a single-sided printing process.

Referring to FIG. 13, the first set of electrodes 14 are printed in a first area 101, the second set of electrodes 17 are printed in a second area 102 offset, for example, along the length of the sheet from the first area 102. A third area 103 may be provided which is free from conductive ink.

Figure 14:
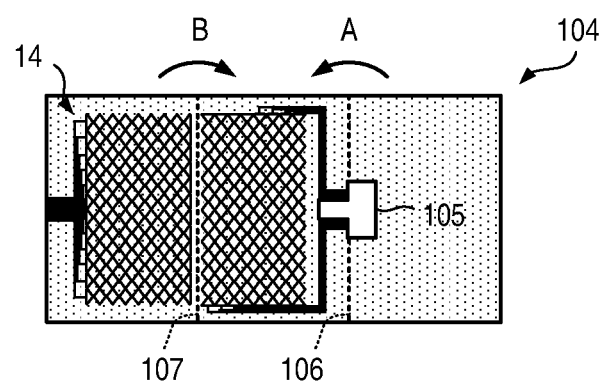
FIG. 14 illustrates construction of a touch-sensitive input device using two sets of electrodes printed on a single side of a sheet.

Referring also to FIG. 14, the sheet 72 may be cut to form a cut out 104 comprising the first and second areas 101, 102 and, optionally the third area 103. The cut out 104 can include aperture 105 (in this case, 'T' shaped) to allow connection to conductive tracks 15 (FIG. 5), 18 (FIG. 6).

The cut out 104 is folded along first and second crease lines 106, 107 so that the first and second sets of electrodes 14, 17 overlap. In this case, the electrodes 14, 17 face each other but are electrically isolated by the third area 103 of the cut out 104 which provides a separating insulating sheet. If the third area 103 is omitted, then a separate separating insulating sheet (not shown) may be provided.

The separating insulating sheet can be omitted. The cut out 104 can be folded so that the first and second sets of electrodes 14, 17 do not face each other, e.g. by being folded away from each other, or face in the same direction, e.g. by stacking.

The areas 101, 102, 103 need not lie in a line along the length of the sheet 72. For example, the first and second areas 101, 102 may be offset across the sheet. Furthermore, if there are three (or more) areas 101, 102, 103, the areas may tile in such a way to include bends, e.g. forming an 'L' shape.

This process can allow the touch-sensitive input device 2 to be made by printing on only one side of the sheet 72 and using simple cutting and converting processes to assemble the device 2, thereby making the device easier and cheaper to make.

It will be appreciated that many modifications may be made to the embodiments hereinbefore described.

For example, different numbers of electrodes can be used, i.e. different values of m and n can be used. For example, m may be lower or higher than 12 (e.g. 4, 8, 16, 32, 64, 128 or more) and/or n may be lower or higher than 8 (e.g. 4, 16, 32, 64, 128 or more).

The electrodes may transmit more than 70% of light. For example, the electrodes may transmit more than 80% of light, more than 90% of light or more than 95% of light.

The electrodes may be formed on separate substrates.

A set of electrodes and a corresponding set of conductive tracks may be made from different materials.

The electrodes and/or conductive tracks may comprise a metallic foil. For example, de-metallised film may be used wherein a layer of metal (such as aluminium) which coats a plastic film (such as PET) is partially removed (i.e. de-metallised) by masking and then etching to leave electrodes and tracks.

The touch-sensitive device may be touch switch.

The substrate(s) may have other different outline shapes. For example, a substrate need not have straight edges, but can have curved edges. The substrates may include slots, slits, holes (which are relatively small compared to the size of a substrate) and/or apertures (which are relatively large compared to the size of a substrate).

The invention claimed is:

1. A method of fabricating a touch-sensitive input device by a moving continuous flow process, the method comprising:
    forming at least one transparent electrode on a first flexible transparent sheet, the at least one electrode comprising a layer of opaque conductive material having holes therein so as to form a mesh of opaque conductive material, the at least one transparent electrode formed by flexographically printing a patterned layer of opaque conductor-based conductive ink onto the first transparent sheet; and
    forming at least one transparent electrode on a second flexible transparent sheet, the at least one electrode comprising a layer of opaque conductive material having holes therein so as to form a mesh of opaque conductive material, the at least one transparent electrode formed by flexographically printing a patterned layer of opaque conductor-based conductive ink onto the second transparent sheet, and
    overlapping the first and second transparent sheets.

2. A method according to claim 1, wherein:
    in the first set of electrodes, width of an electrode between outermost edges of the electrode periodically increases and decreases along the electrode so as to form wide sections and narrow sections of the electrode, the electrodes being arranged so as to form narrow and wide spaces between adjacent electrodes,
    in the second set of electrodes, width of an electrode between outermost edges of the electrode periodically increases and decreases along the electrode so as to form wide sections and narrow sections of the electrode, and wide sections of electrode in the second set of electrodes are disposed in wide spaces between adjacent electrodes in the first set of electrodes.

3. A method according to claim 2, wherein the wide sections are lozenge shaped.

4. A method according to claim 2, wherein the wide section of an electrode in the first set of electrodes has a maximum width of between 5 mm and 20 mm.

5. A method according to claim 2, wherein the narrow section of an electrode in the first set of electrodes has a minimum width of between 1 mm and 5 mm.

6. A method according to claim 2, wherein the wide space between adjacent electrodes in the first set of electrodes has a maximum width of between 5 mm and 20 mm.

7. A method according to claim 1, wherein each electrode has a length of at least 100 mm.

8. A method according to claim 1, further comprising:
    at least one conductive track, each conductive track running from or close to an edge of the substrate and being directly connected to a respective transparent electrode, the conductive track a higher sheet resistance than the transparent electrode.

9. A method according to claim 1, wherein the conductor comprises a metal-based conductive ink or a carbon-based conductive ink.

10. A method according to claim 1, wherein at least some of the transparent electrodes comprise a metallic foil.

11. A method according to claim 1, wherein the layer of opaque conductive material has a thickness of at least 8 μm, at least 10 μm, at least 12 μm or at least 15 μm.

12. A method according to claim 1, wherein the sheet comprises a plastic material.

13. A method of fabricating a touch-sensitive input device by a moving continuous flow process, the method comprising:
    forming at least one transparent electrode on a transparent sheet, the at least one electrode comprising a layer of opaque conductive material having holes therein so as to form a mesh of opaque conductive material,
    wherein forming the at least one transparent electrode comprises:
    forming at least one transparent electrode on a first face of the substrate by flexographically printing a first patterned layer of opaque conductor-based conductive ink onto the transparent sheet; and
    forming at least one transparent electrode on a second face of the substrate by flexographically printing a second patterned layer of opaque conductor-based conductive ink onto the transparent sheet.

14. A method according to claim 13, wherein:
    in the first set of electrodes, width of an electrode between outermost edges of the electrode periodically increases and decreases along the electrode so as to form wide sections and narrow sections of the electrode, the electrodes being arranged so as to form narrow and wide spaces between adjacent electrodes,
    in the second set of electrodes, width of an electrode between outermost edges of the electrode periodically increases and decreases along the electrode so as to form wide sections and narrow sections of the electrode, and wide sections of electrode in the second set of electrodes are disposed in wide spaces between adjacent electrodes in the first set of electrodes.

15. A method according to claim 14, wherein the wide sections are lozenge shaped.

16. A method according to claim 14, wherein the wide section of an electrode in the first set of electrodes has a maximum width of between 5 mm and 20 mm.

17. A method according to claim 14, wherein the narrow section of an electrode in the first set of electrodes has a minimum width of between 1 mm and 5 mm.

18. A method according to claim 14, wherein the wide space between adjacent electrodes in the first set of electrodes has a maximum width of between 5 mm and 20 mm.

19. A method according to claim 13, wherein each electrode has a length of at least 100 mm.

20. A method according to claim 13, further comprising:
at least one conductive track, each conductive track running from or close to an edge of the substrate and being directly connected to a respective transparent electrode, the conductive track a higher sheet resistance than the transparent electrode.

21. A method according to claim 13, wherein the conductor comprises a metal-based conductive ink or a carbon-based conductive ink.

22. A method according to claim 13, wherein at least some of the transparent electrodes comprise a metallic foil.

23. A method according to claim 13, wherein the layer of opaque conductive material has a thickness of at least 8 μm, at least 10 μm, at least 12 μm or at least 15 μm.

24. A method according to claim 13, wherein the sheet comprises a plastic material.

* * * * *